United States Patent [19]

Sanghani et al.

[11] Patent Number: 5,896,396
[45] Date of Patent: Apr. 20, 1999

[54] METHOD AND APPARATUS FOR SCAN TEST OF SRAM FOR MICROPROCESSORS WITHOUT FULL SCAN CAPABILITY

[75] Inventors: Amit D. Sanghani, Santa Clara; Sridhar Narayanan, Sunnyvale, both of Calif.

[73] Assignee: Sun Microsystems, Inc., Palo Alto, Calif.

[21] Appl. No.: 08/880,929

[22] Filed: Jun. 23, 1997

[51] Int. Cl.$^6$ .................................................. G06F 11/00
[52] U.S. Cl. ....................................... 371/21.1; 371/22.31
[58] Field of Search ............................... 371/21.1, 22.31, 371/22.32, 22.1; 395/183.05

[56] References Cited

U.S. PATENT DOCUMENTS 5,701,307  12/1997  Whetsel ................................. 371/22

*Primary Examiner*—Vincent P. Canney
*Attorney, Agent, or Firm*—D'Alessandro & Ritchie

[57] ABSTRACT

An apparatus for allowing a RAM array within an SRAM to be tested via scan ATPG is disclosed. A first clocked flip-flop has a data input latched high, a scan-in input latched high, a clock input coupled to a signal source generating a periodic waveform, a scan-enable input coupled to a scan enable signal, and an output. The first flip-flop inverts the data input at the output when the scan enable signal is low, and places the scan-in input signal at the output when the scan enable signal is high. A second clocked flip-flop has a data input coupled to the output of the first flip-flop, a scan-in input latched high, a clock input coupled to the signal source, a scan enable input coupled to the scan enable signal, and an output. The second flip-flop inverts the data input at the output when the scan enable signal is low, and places the scan-in input signal at the output when the scan enable signal is high. A third clocked flip-flop has a third flip-flop data input coupled to an inversion of the second flip-flop output, a third flip-flop scan-in input, a clock input coupled to the signal source, a scan enable input latched low, and a third flip-flop output, the third flip-flop inverting the third flip-flop data input at the third flip-flop output. A first AND gate has a first input coupled to an inversion of the scan enable signal, a second input coupled to the second flip-flop output, and a first AND gate output. A second AND gate has a first input coupled to the first AND gate output, a second input coupled to the third flip-flop output, and a second AND gate output coupled to a write enable signal enabling the SRAM

6 Claims, 3 Drawing Sheets

METHOD AND APPARATUS FOR SCAN TEST OF SRAM FOR MICROPROCESSORS WITHOUT FULL SCAN CAPABILITY

RELATED APPLICATION DATA

Co-pending application Ser. No. 8/880,929 (attorney docket number SUN-P2530), is filed the same day as this application, and is Entitled "METHOD AND APPARATUS FOR SCAN TEST OF SRAM FOR MICROPROCESSORS WITHOUT FULL SCAN CAPABILITY", by inventors Amit Sanghani and Sridhar Narayanan, assignors to Sun Microsystems, a Delaware Corporation.

BACKGROUND OF THE INVENTION

1. Field of the Invention

The present invention relates to an apparatus for testing embedded memory arrays within a microprocessor. More particularly, the invention relates to an apparatus for testing negative edge SRAM arrays not having dedicated test circuitry via scan ATPG and other memory test algorithms.

2. The Prior Art

Large RAM arrays embedded in microprocessors are typically tested via a dedicated test mode with dedicated pins. However, small RAM arrays do not include dedicated test mode capability, since such a capability would increase die size and performance overhead. Therefore, small RAM arrays and large RAM arrays must be tested separately.

Testing of microprocessor chips is typically performed sequentially in three separate stages. Typically, embedded large memory arrays are tested during a first stage. Next, during a second stage, the portion of the microprocessor chip excluding the memory arrays is tested via scan Automatic Test Pattern Generation (ATPG). The small memory arrays are normally disabled during the scan mode to avoid corruption of the RAM. Therefore, the embedded small memory arrays must be tested during a separate third stage.

Some microprocessor chips do not have full scan capability. Thus, only the outputs are scannable via scan ATPG. A need exists in the prior art for an apparatus for testing the small memory arrays during scan ATPG. Similarly, a need exists in the prior art for an apparatus for testing memory arrays that do not include dedicated test circuitry during scan ATPG. Moreover, it would be preferable to implement such a means while minimizing die size and performance overhead.

BRIEF DESCRIPTION OF THE INVENTION

A first clocked flip-flop has a first flip-flop data input latched high, a first flip-flop scan-in input latched high, a clock input coupled to an externally controlled signal source generating a periodic waveform, a scan-enable input coupled to a scan enable signal, and a first flip-flop output. The first flip-flop inverts the first flip-flop data input at the first flip-flop output when the scan enable signal is low, and places the first flip-flop scan-in input signal at the first flip-flop output when the scan enable signal is high. A second clocked flip-flop has a second flip-flop data input coupled to the first flip-flop output, a second flip-flop scan-in input latched high, a clock input coupled to the signal source, a scan enable input coupled to the scan enable signal, and a second flip-flop output. The second flip-flop inverts the second flip-flop data input at the second flip-flop output when the scan enable signal is low, and places the second flip-flop scan-in input signal at the second flip-flop output when the scan enable signal is high. A third clocked flip-flop has a third flip-flop data input coupled to an inversion of the second flip-flop output, a third flip-flop scan-in input, a clock input coupled to the signal source, a scan enable input latched low, and a third flip-flop output. The third flip-flop inverts the third flip-flop data input at the third flip-flop output. A first AND gate has a first input coupled to an inversion of the scan enable signal, a second input coupled to the second flip-flop output, and a first AND gate output. A second AND gate has a first input coupled to the first AND gate output, a second input coupled to the third flip-flop output, and a second AND gate output coupled to a write enable signal enabling the SRAM.

The present invention allows testing of memory arrays via scan ATPG, decreasing the total time required to test each microprocessor chip. The invention is applicable to RAMs which are read or written at the negative edge of the clock. Furthermore, output lines must be scannable. The RAM is enabled by a write-enable signal.

The chip starts out in the functional mode of operation. After shifting appropriate values for the control signals during the test mode, a first access is performed in the normal mode to set up the data lines and control lines. A second access is performed in the normal mode to read or write the data to the RAM array, depending upon the control signals, address and data lines. The test mode is then used to shift out the outputs. During the test mode, the write enable signal is deasserted to disable unwanted writes to the array, and the scan-enable signal is asserted. During the normal mode, while the scan-enable signal is deasserted, the write enable signal is normally asserted. A valid write will occur after the last shift clock when the control lines are set up. However, when a clock signal is asserted during the normal mode to initialize the data lines and address lines, or to capture the data, an unwanted write will occur during this capture mode, causing corruption of the RAM. The present invention alleviates this problem by forcing the write enable signal low during these two capture modes.

DETAILED DESCRIPTION OF THE PREFERRED EMBODIMENTS

Those of ordinary skill in the art will realize that the following description of the present invention is illustrative only and not in any way limiting. Other embodiments of the invention will readily suggest themselves to such skilled persons.

The present invention ensures that the write enable signal is deasserted during the capture mode of the scan ATPG. This avoids the undesirable write resulting in corruption of the RAM, allowing memory arrays to be tested via scan ATPG and other memory test algorithms.

Specifically, the presently preferred embodiment of the present invention is designed for use with a negative edge SRAM. Since the SRAM is read or written at the negative edge of the clock, control lines will be set at the positive edge of the clock. However, one of ordinary skill in the art will recognize that with inversion of the clock signal, the present invention may be used with a positive edge SRAM. Furthermore, since the invention is for use with the scan ATPG, output lines must be scannable. Therefore, read/write of RAM is done at the negative edge of the clock, and values for control lines will be set at the positive edge of the clock. A write enable signal enables the RAM.

Figure 1:
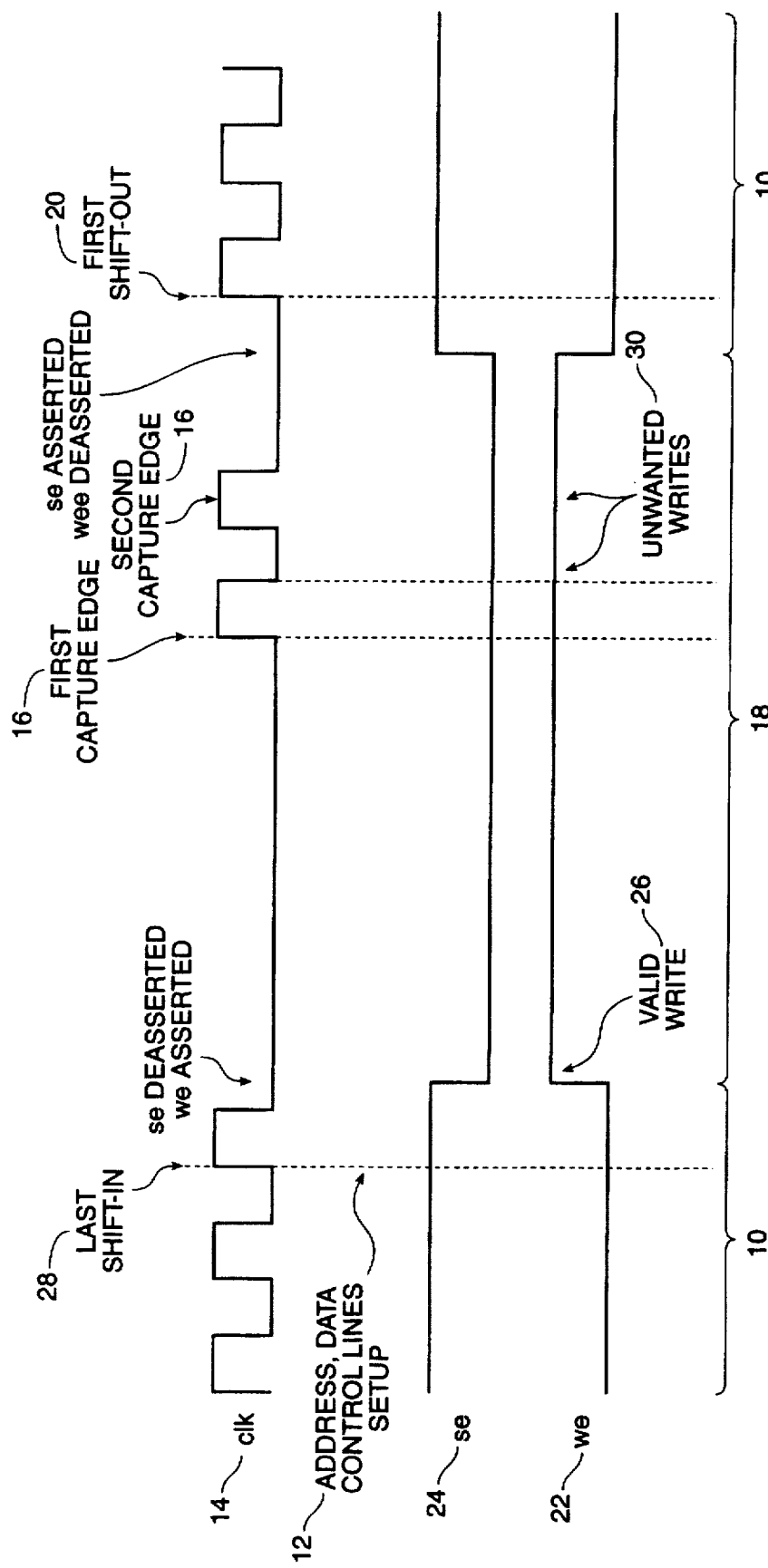
FIG. 1 illustrates waveforms resulting when a RAM array is written during scan ATPG according to the prior art.

Referring first to FIG. 1, waveforms resulting when a RAM array is written during scan ATPG according to the prior art are shown. The chip starts out in the functional mode of operation, not shown. During test mode 10, appropriate values for the control signals are shifted 12 into the RAM at the positive edge of a clock 14. Next, a first write, or capture edge 16, is performed in normal mode 18, to initialize the data and address lines. Next, a second write, or capture edge 16, is performed in normal mode 18, depending upon the control signals, address and data lines. The test mode 10 is then used to shift out 20 the outputs. During the test mode 10, write enable signal 22 is deasserted to disable unwanted writes to the array, and scan-enable signal 24 is asserted. During the normal mode 18, while the scan-enable signal 24 is deasserted to disable the scan circuitry on the RAM chip, the write enable signal 22 is normally asserted. A valid write 26 will occur after last shift clock 28 when the control lines are set up. However, when the clock signal 14 is asserted during the normal mode 18 to initialize the address and data lines, or to capture the data, an unwanted write 30 will occur during this capture mode, causing corruption of the RAM. The present invention alleviates this problem by forcing the write enable signal 22 low during the capture mode.

Figure 2:
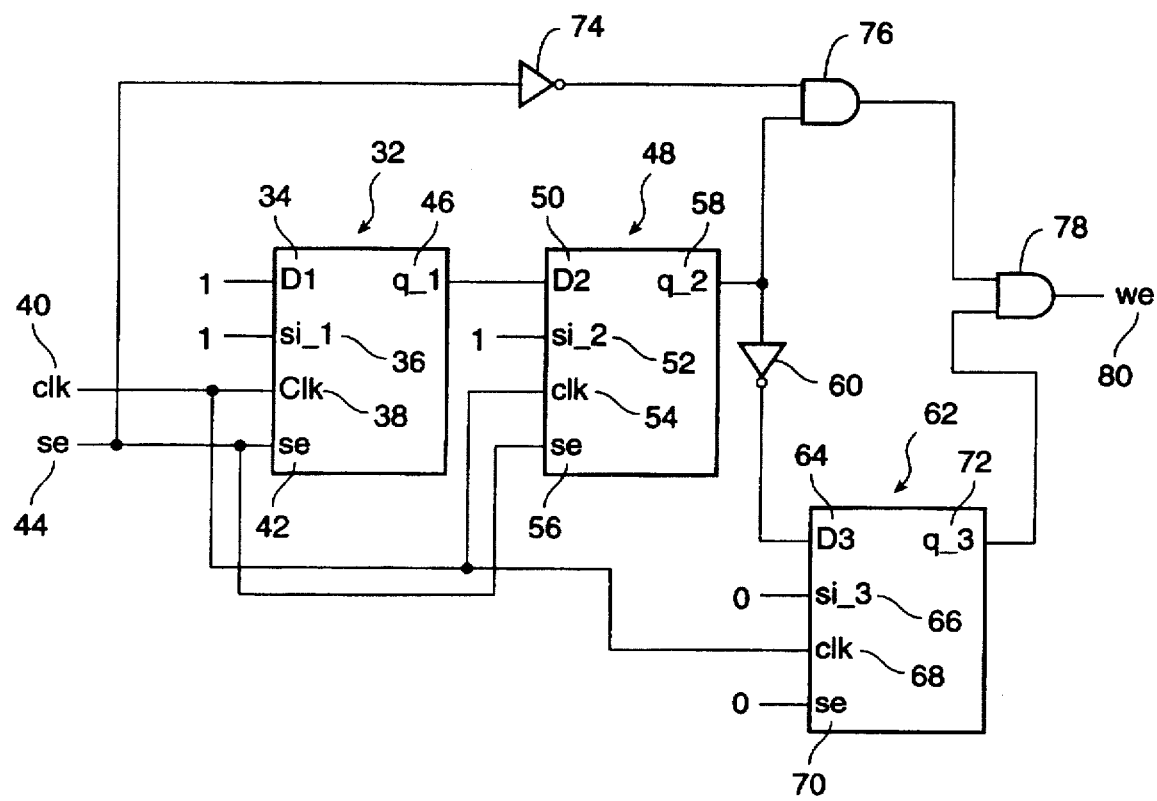
FIG. 2 illustrates a circuit diagram of a presently preferred embodiment of the present invention.

Referring now to FIG. 2, a circuit diagram of the presently preferred embodiment of the present invention is shown. The presently preferred embodiment of the present invention comprises two synchronously clocked flip-flops. A first clocked flip-flop 32 has a first flip-flop data input 34, a first flip-flop scan in input 36, a first flip-flop clock input 38 coupled to an externally controlled periodic waveform generator 40, a first flip-flop select line, or first flip-flop scan enable input 42, coupled to a scan enable signal 44, and a first flip-flop output 46. The first flip-flop data input 34 is latched high. Similarly, the first flip-flop scan in input 36 is latched high. When the scan enable signal 44 is high, the first flip-flop 32 places the first flip-flop scan-in input signal 36 at the first flip-flop output 46. However, when the scan enable signal 44 is low, the first flip-flop 32 inverts the first flip-flop data input 34 at the first flip-flop output 46.

A second clocked flip-flop 48 has a second flip-flop data input 50 coupled to the first flip-flop output 46, a second flip-flop scan in input 52, a second flip-flop clock input 54 coupled to the externally controlled periodic waveform generator 40, a second flip-flop select line, or second flip-flop scan enable input 56, coupled to the scan enable signal 44, and a second flip-flop output 58. The second flip-flop scan in input 52 is latched high. When the scan enable signal 44 is high, the second flip-flop 48 places the second flip-flop scan-in input signal 52 at the second flip-flop output 58.

However, when the scan enable signal 44 is low, the second flip-flop 48 inverts the second flip-flop data input 50 at the second flip-flop output 58. The second flip-flop output 58 is then inverted by inverter 60. According to a presently preferred embodiment of the present invention, a modified flip-flop is used for the flip-flops 32, 48, 62. The modified flip-flop is a scannable flip-flop, which acts as a D flip-flop in normal mode, and operates as a scan flop in test mode. However, one of ordinary skill in the art will recognize that alternative circuit elements may be used to achieve the same result.

A third clocked flip-flop 62 has a third flip-flop data input 64 coupled to the inverted second flip-flop output, a third flip-flop scan in input 66, a third flip-flop clock input 68 coupled to the externally controlled periodic waveform generator 40, a third flip-flop select line, or third flip-flop scan enable input 70 latched low, and a third flip-flop output 72. The scan enable input 70 is latched low. When the scan enable input 70 is low, the third flip-flop 62 inverts the third flip-flop data input 64 at the third flip-flop output 72. Therefore, since the third flip-flop scan in input 66 is not deterministic, it may be latched low or high. According to a presently preferred embodiment of the present invention, a modified flip-flop is used. The modified flip-flop acts as a D flip-flop in normal mode, and enables scanning in test mode. However, one of ordinary skill in the art will recognize that alternative circuit elements may be used to achieve the same result.

The scan enable signal 44 is inverted by an inverter 74. A first AND gate 76 having a first input coupled to the output of the inverter 74 and a second input coupled to the second flip-flop output 58 has an output coupled to a first input of a second AND gate 78. A second input of the AND gate 78 is coupled to the third flip-flop output 72. The output of the AND gate 78 is coupled to a write enable input 80 to the RAM. Although the circuit is designed for use with a negative edge SRAM, inclusion of an inverter to invert the signal to the clock inputs 38, 54, 68 will allow the present invention to be used with a positive edge SRAM.

TABLE 1

|  | SE' | D1 | SL_1 | Q_1 | D2 | SL_2 | Q_2 | D3 | SL_3 | Q_3 | WE |
| --- | --- | --- | --- | --- | --- | --- | --- | --- | --- | --- | --- |
| Functional mode | 1 | 1 | 1 | 0 | 0 | 1 | 1 | 0 | 0/1 | 1 | 1 |
| Test/shift/scan-in mode | 0 | 1 | 1 | 1 | 1 | 1 | 1 | 0 | 0/1 | 1 | 0 |
| Region between shift & capture modes | 1 | 1 | 1 | 1 | 1 | 1 | 1 | 0 | 0/1 | 1 | 1 |
| First capture mode | 1 | 1 | 1 | 0 | 0 | 1 | 0 | 1 | 0/1 | 1 | 0 |
| Second capture mode | 1 | 1 | 1 | 0 | 0 | 1 | 1 | 0 | 0/1 | 0 | 0 |

The function of the present invention during all operational modes is shown above in TABLE 1. In the functional mode, the scan-enable signal SE 44 is deasserted. During this state, the first flip-flop 32 inverts the first flip-flop data input D1 34 at the first flip-flop output Q_1 46. The first flip-flop output Q_1 46 is coupled to the second flip-flop data input D2 50. Since the scan-enable signal SE 44 is low, the second flip-flop 48 inverts the second flip-flop data input D2 50 at the second flip-flop output Q_2 58. The second flip-flop output Q_2 58 is inverted through the inverter 60 at the third flip-flop data input D3 64. The third flip-flop scan enable input 70 is latched low. When the scan enable input 70 is low, the third flip-flop 62 inverts the third flip-flop data input 64 at the third flip-flop output 72. Therefore, as indicated above, the output of AND gate 78 and the write enable signal WE 80 are both high.

During the test mode, the write enable signal 80 is deasserted to disable unwanted writes to the array. In addition, the scan-enable signal 44 is asserted. During this state, the first flip-flop 32 passes the first flip-flop scan in input SI_1 36 through to the first flip-flop output Q_1 46. The first flip-flop output Q_1 46 is coupled to the second flip-flop input D2 50. Since the scan-enable signal SE 44 is asserted, the second flip-flop 48 passes the second flip-flop scan in input SI_2 52 through to the second flip-flop output Q_2 58. The second flip-flop output Q_2 58 is inverted through the inverter 60 at the third flip-flop data input D3 64. The third flip-flop scan enable input 70 is latched low. When the scan enable input 70 is low, the third flip-flop 62 inverts the third flip-flop data input 64 at the third flip-flop output 72. However, since the scan-enable signal 44 is asserted, the output of AND gate 78 and the write enable signal WE 80 are both low.

In the region between the end of the test mode and the beginning of the capture mode, the scan-enable signal 44 is deasserted. Since there are no clock cycles during this mode, the flip-flops 32, 48 maintain their previous state. Therefore, in this region, the write enable signal WE 80 is high.

During the first capture mode, since dedicated test mode capability is not available, address and data lines must be initialized. The scan-enable signal 44 remains deasserted. During this state, the first flip-flop 32 inverts the first flip-flop data input D1 34 at the first flip-flop output Q_1 46. The first flip-flop output Q_1 46 is coupled to the second flip-flop data input D2 50. Since the scan-enable signal SE 44 is low, the second flip-flop 48 inverts the second flip-flop data input D2 50 at the second flip-flop output Q_2 58. However, since a clock signal is asserted, the value of the second flip-flop data input D2 50 inverted at the second flip-flop output Q_2 58 is the value obtained during the previous time region. Similarly, the value of the third flip-flop data input D3 64 inverted at the third flip-flop output Q_3 72 is the value obtained during the previous time region. However, since the second flip-flop output Q_2 58 is low, the output of AND gates 76 and 78 is low. Therefore, the write enable signal WE 80 is forced low during the first capture mode to avoid corruption of the RAM.

In the second capture mode, the scan-enable signal remains deasserted. During this state, the first flip-flop inverts 32 the first flip-flop data input D1 34 at the first flip-flop output Q_1 46. The first flip-flop output Q_1 46 is coupled to the second flip-flop data input D2 50. Since the scan-enable signal SE 44 is low, the second flip-flop 48 inverts the second flip-flop data input D2 50 at the second flip-flop output Q_2 58. However, since a clock signal is asserted, the value of the second flip-flop data input D2 50 inverted at the second flip-flop output Q_2 58 is the value obtained during the previous time region. Similarly, the value of the third flip-flop data input D3 64 inverted at the third flip-flop output Q_3 72 is the value obtained during the previous time region. Therefore, since the third flip-flop output Q_3 72 is low, the output of AND gate 78 is low. Therefore, the write enable signal WE 80 is forced low during the second capture mode to avoid corruption of the RAM.

Figure 3:
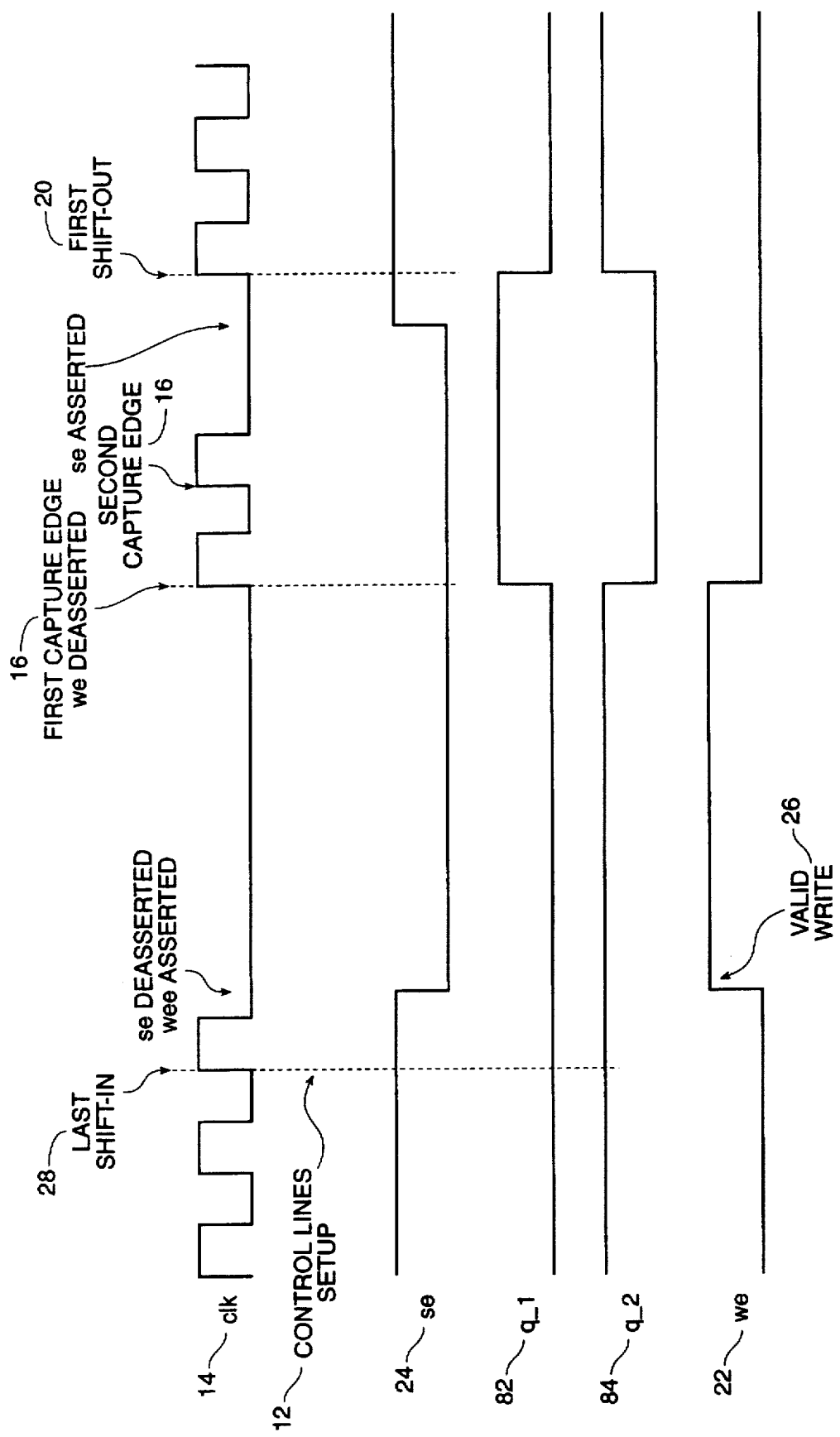
FIG. 3 illustrates waveforms resulting when a RAM array is written during scan ATPG according to a presently preferred embodiment of the present invention.

Referring now to FIG. 3, waveforms resulting when a RAM array is written during scan ATPG according to a presently preferred embodiment of the present invention are presented. Output waveforms for the first flip-flop 82 and the second flip-flop 84 are illustrated. Through deassertion of the write enable signal 22 during the capture mode 16, the unwanted write to the RAM is disabled.

The present invention provides a means for testing memory arrays during scan ATPG. This invention is particularly useful in testing memory arrays which do not include dedicated test circuitry in microprocessors without full scan capability. Accordingly, the present invention decreases the time required to test a microprocessor chip. This results in a substantial decrease in production cost per microprocessor chip.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a microprocessor having an SRAM, an apparatus for allowing a RAM array to be tested, the SRAM having scannable outputs, the apparatus comprising:

a first clocked flip-flop having a first flip-flop data input latched high, a first flip-flop scan-in input latched high, a clock input coupled to an externally controlled signal source generating a periodic waveform, a scan-enable input coupled to a scan enable signal, and a first flip-flop output, the first flip-flop inverting the first flip-flop data input at the first flip-flop output when the scan enable signal is low, and placing the first flip-flop scan-in input signal at the first flip-flop output when the scan enable signal is high;

a second clocked flip-flop having a second flip-flop data input coupled to the first flip-flop output, a second flip-flop scan-in input latched high, a clock input coupled to the signal source, a scan enable input coupled to the scan enable signal, and a second flip-flop output, the second flip-flop inverting the second flip-flop data input at the second flip-flop output when the scan enable signal is low, and placing the second flip-flop scan-in input signal at the second flip-flop output when the scan enable signal is high;

a third clocked flip-flop having a third flip-flop data input coupled to an inversion of the second flip-flop output, a third flip-flop scan-in input, a clock input coupled to the signal source, a scan enable input latched low, and a third flip-flop output, the third flip-flop inverting the third flip-flop data input at the third flip-flop output;

a first AND gate having a first input coupled to an inversion of the scan enable signal, a second input coupled to the second flip-flop output, and a first AND gate output; and a second AND gate having a first input coupled to the first AND gate output, a second input coupled to the third flip-flop output, and a second AND gate output coupled to a write enable signal enabling the SRAM.

2. The claim according to claim 1, wherein the inverted scan enable signal comprises an inverter having an input coupled to the scan enable signal and an output producing the inverted scan enable signal.

3. In a microprocessor having an SRAM, the SRAM having a scan-enable signal and a write-enable signal, scannable outputs, the SRAM having non-scannable address lines, data lines, and control lines, the control lines including a read/write signal, an apparatus for allowing a RAM array to be tested via scan ATPG, the apparatus comprising:

means for setting the scan-enable signal high and the write-enable signal low in response to a clock transition in a first direction;

means for forcing the write-enable signal low when the scan-enable signal is low in response to a clock transition in the first direction;

means for initializing the address lines, the data lines, and the control lines when the scan-enable signal is low in response to a clock transition in the first direction;

means for storing data in the RAM array when the scan-enable signal is low in response to a clock transition in a second direction opposite to that of the first direction; and means for scanning the data out of the RAM array when the scan-enable signal is high and the write-enable signal is low in response to a clock transition in the first direction.

4. In a microprocessor having an SRAM, the SRAM having a scan-enable signal and a write-enable signal, scannable outputs, the SRAM having non-scannable address lines, data lines, and control lines, the control lines including a read/write signal, a method for allowing a RAM array to be tested via scan ATPG, the method comprising the following steps:

setting the scan-enable signal high and the write-enable signal low in response to a clock transition in a first direction;

forcing the write-enable signal low when the scan-enable signal is low in response to a clock transition in the first direction;

initializing the address lines, the data lines, and the control lines when the scan-enable signal is low in response to a clock transition in the first direction;

storing data in the RAM array when the scan-enable signal is low in response to a clock transition in a second direction opposite to that of the first direction; and scanning the data out of the RAM array when the scan-enable signal is high and the write-enable signal is low in response to a clock transition in the first direction.

5. In a microprocessor having an SRAM, a first clocked flip-flop having a first flip-flop data input latched high, a first flip-flop scan-in input latched high, a clock input coupled to an externally controlled signal source generating a periodic waveform, a scan-enable input coupled to a scan enable signal, and a first flip-flop output, the first flip-flop inverting the first flip-flop data input at the first flip-flop output when the scan enable signal is low, and placing the first flip-flop scan-in input signal at the first flip-flop output when the scan enable signal is high, a second clocked flip-flop having a second flip-flop data input coupled to the first flip-flop output, a second flip-flop scan-in input latched high, a clock input coupled to the signal source, a scan enable input coupled to the scan enable signal, and a second flip-flop output, the second flip-flop inverting the second flip-flop data input at the second flip-flop output when the scan enable signal is low, and placing the second flip-flop scan-in input signal at the second flip-flop output when the scan enable signal is high, a third clocked flip-flop having a third flip-flop data input coupled to an inversion of the second flip-flop output, a third flip-flop scan-in input, a clock input coupled to the signal source, a scan enable input latched low, and a third flip-flop output, the third flip-flop inverting the third flip-flop data input at the third flip-flop output, a first AND gate having a first input coupled to an inversion of the scan enable signal, a second input coupled to the second flip-flop output, and a first AND gate output, and a second AND gate having a first input coupled to the first AND gate output, a second input coupled to the third flip-flop output, and a second AND gate output coupled to a write enable signal enabling the SRAM, the SRAM having a scan-enable signal and a write-enable signal, scannable outputs, non-scannable address lines, data lines, and control lines, a method for allowing a RAM array to be tested, the method comprising the following steps:

setting the scan-enable signal high and the write-enable signal low in response to a clock transition in a first direction, the step of setting further including the steps of clocking the first flip-flop,
clocking the second flip-flop, and
clocking the third flip-flop;

forcing the write-enable signal low when the scan-enable signal is low in response to a clock transition in the first direction;

initializing the address lines, the data lines, and the control lines when the scanenable signal is low in response to a clock transition in the first direction, the step of initializing further including the steps of clocking the first flip-flop,
clocking the second flip-flop, and
clocking the third flip-flop;

storing data in the RAM array when the scan-enable signal is low in response to a clock transition in a second direction opposite to that of the first direction, the step of storing further including the steps of clocking the first flip-flop,
clocking the second flip-flop, and
clocking the third flip-flop; and scanning the data out of the RAM array when the scan-enable signal is high and the write-enable signal is low in response to a clock transition in the first direction, the step of scanning data out of the RAM array further including the steps of clocking the first flip-flop, clocking the second flip-flop, and clocking the third flip-flop.

6. In a microprocessor having an SRAM, the SRAM having a scan-enable signal and a write-enable signal, scannable outputs, the SRAM having non-scannable address lines, data lines, and control lines, the control lines including a read/write signal, a method for allowing a RAM array to be tested via scan ATPG, the method comprising the following steps:

providing a first clocked flip-flop having a first flip-flop data input latched high, a first flip-flop scan-in input latched high, a clock input coupled to an externally controlled signal source generating a periodic waveform, a scan-enable input coupled to a scan enable signal, and a first flip-flop output, the first flip-flop inverting the first flip-flop data input at the first flip-flop output when the scan enable signal is low, and placing the first flip-flop scan-in input signal at the first flip-flop output when the scan enable signal is high;

providing a second clocked flip-flop having a second flip-flop data input coupled to the first flip-flop output, a second flip-flop scan-in input latched high, a clock input coupled to the signal source, a scan enable input coupled to the scan enable signal, and a second flip-flop output, the second flip-flop inverting the second flip-flop data input at the second flip-flop output when the scan enable signal is low, and placing the second flip-flop scan-in input signal at the second flip-flop output when the scan enable signal is high;

providing a third clocked flip-flop having a third flip-flop data input coupled to an inversion of the second flip-flop output, a third flip-flop scan-in input, a clock input coupled to the signal source, a scan enable input latched low, and a third flip-flop output, the third flip-flop inverting the third flip-flop data input at the third flip-flop output;

providing a first AND gate having a first input coupled to an inversion of the scan enable signal, a second input coupled to the second flip-flop output, and a first AND gate output;

providing a second AND gate having a first input coupled to the first AND gate output, a second input coupled to the third flip-flop output, and a second AND gate output coupled to a write enable signal enabling the SRAM;

setting the scan-enable signal high and the write-enable signal low in response to a clock transition in a first direction, the step of setting further including the steps of
clocking the first flip-flop,
clocking the second flip-flop, and
clocking the third flip-flop;

forcing the write-enable signal low when the scan-enable signal is low in response to a clock transition in the first direction;

initializing the address lines, the data lines, and the control lines when the scanenable signal is low in response to a clock transition in the first direction, the step of initializing further including the steps of
clocking the first flip-flop,
clocking the second flip-flop, and
clocking the third flip-flop;

storing data in the RAM array when the scan-enable signal is low in response to a clock transition in a second direction opposite to that of the first direction, the step of storing further including the steps of
clocking the first flip-flop,
clocking the second flip-flop, and
clocking the third flip-flop; and scanning the data out of the RAM array when the scan-enable signal is high and the write-enable signal is low in response to a clock transition in the first direction, the step of scanning data out of the RAM array further including the steps of clocking the first flip-flop, clocking the second flip-flop, and clocking the third flip-flop.

* * * * *

UNITED STATES PATENT AND TRADEMARK OFFICE
CERTIFICATE OF CORRECTION

PATENT NO. : 5,896,396
DATED : April 27, 1999
INVENTOR(S) : Amit Sanghani and Sridhar Narayanan It is certified that error appears in the above-identified patent and that said Letters Patent is hereby corrected as shown below:

On column 10, line 2, replace "scanenable" with --scan-enable--.

Signed and Sealed this

Ninth Day of November, 1999

Attest:

Q. TODD DICKINSON

*Attesting Officer*    *Acting Commissioner of Patents and Trademarks*